(12) United States Patent
Zhu et al.

(10) Patent No.: US 9,229,286 B2
(45) Date of Patent: Jan. 5, 2016

(54) ARRAY SUBSTRATE, MANUFACTURING METHOD FOR THE SAME AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiaming Zhu, Beijing (CN); Liang Sun, Beijing (CN); Jianfeng Yuan, Beijing (CN); Seung Moo Rim, Beijing (CN); Xibin Shao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 246 days.

(21) Appl. No.: 14/108,856

(22) Filed: Dec. 17, 2013

(65) Prior Publication Data

US 2014/0168559 A1   Jun. 19, 2014

(30) Foreign Application Priority Data

Dec. 18, 2012   (CN) .......................... 2012 1 0552372

(51) Int. Cl.
  *G02F 1/1333*    (2006.01)
  *G02F 1/1362*    (2006.01)
  *H01L 27/12*    (2006.01)

(52) U.S. Cl.
  CPC ........ *G02F 1/136204* (2013.01); *H01L 27/124* (2013.01)

(58) Field of Classification Search
None
See application file for complete search history.

(56) References Cited

U.S. PATENT DOCUMENTS

| 6,184,948 B1 | 2/2001 | Lee |
| 6,654,074 B1 | 11/2003 | Ha et al. |
| 2002/0021376 A1 | 2/2002 | Yoo et al. |

FOREIGN PATENT DOCUMENTS

| CN | 100335959 C | 9/2007 |
| CN | 203117616 U | 8/2013 |

OTHER PUBLICATIONS

Chinese Office Action regarding Application No. 2012105523726 dated Sep. 1, 2014. Translation provided by Dragon Intellectual Property Law Firm.

*Primary Examiner* — Richard Kim
(74) *Attorney, Agent, or Firm* — Harness, Dickey & Pierce, P.L.C.

(57) ABSTRACT

According to one aspect of the present invention, the provided is an array substrate. Specifically, the first conductive strip that is coupled to the first data shorting bar and the second conductive strip that is coupled to the second data shorting bar are formed on the array substrate. The width of the first conductive strip is greater than the width of the first data shorting bar. The width of the second conductive strip is greater than the width of the second data shorting bar. The first conductive strip is overlapped with the second conductive strip. Such a structure of the array substrate effectively increases the overlapped capacitance between the data metal layer and the gate metal layer.

17 Claims, 10 Drawing Sheets

Fig. 1

-Prior Art-

ARRAY SUBSTRATE, MANUFACTURING METHOD FOR THE SAME AND DISPLAY DEVICE

CROSS REFERENCE OF THE RELATED APPLICATIONS

The present application claims priority to and incorporates by reference the entire contents of Chinese priority document 201210552372.6, filed in China on Dec. 18, 2012.

BACKGROUND OF THE INVENTION

1. Field of the Invention

The present invention relates to the technical field of displaying, and more particularly to an array substrate, a manufacturing method for the same, and a display device.

2. Description of the Prior Art

In the manufacturing process for an array substrate of the Thin Film Transistor-Liquid Crystal Display (TFT-LCD), an important procedure for ensuring the production yield rate lies in preventing and controlling the occurrence of discharging of the static electricity.

An Advanced Super Dimension Switch (ADS) LCD is taken as an example. Advanced Super Dimension Switch may form a multi-dimensional electric field mainly by an electric field generated by a slit electrode edge and another electric field generated between a slit electrode layer and a plate electrode layer on a same plane, so that each of all oriented liquid crystal molecules between the slit electrodes in a liquid crystal box and just above the electrodes may render a rotation, and thus the operation efficiency of the liquid crystals is improved and the light transmission efficiency is increased. The ADS may improve the image quality of a TFT-LCD product, and has the advantages of high resolution, high transmittance, low power consumption, wide viewing angle, high aperture ratio, low chromatic aberration, push Mura free, and etc.

Figure 1:
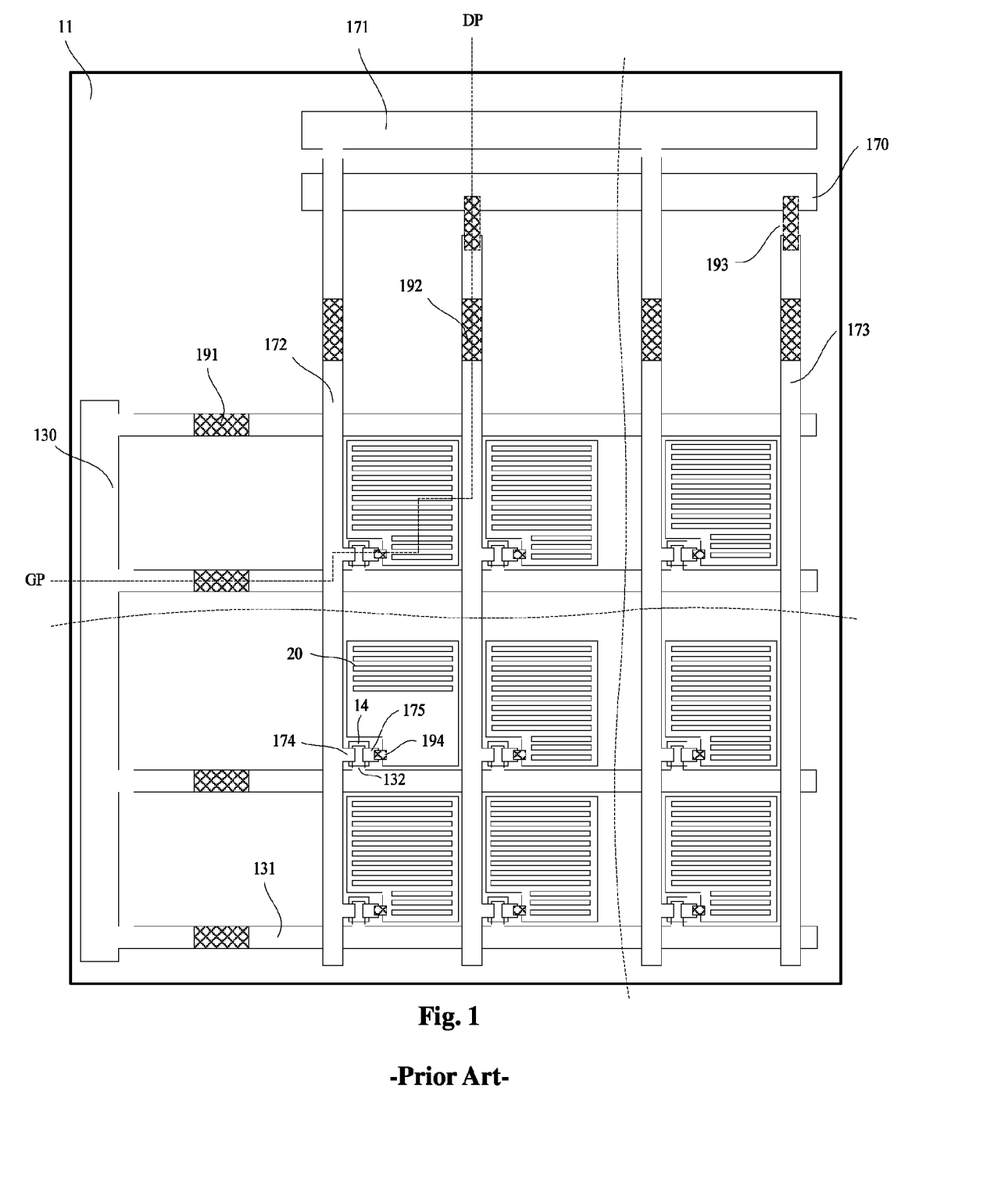
FIG. 1 illustrates a layout diagram for an array substrate of a conventional ADS LCD.

FIG. 1 illustrates a layout diagram for an array substrate of a conventional ADS LCD, and the array substrate comprises an even data shorting bar 170 formed by etching a gate metal layer and an odd data shorting bar 171 formed by etching a data metal layer. The even data shorting bar 170 is coupled to a data line in even columns on the array substrate by a via hole, and the odd data shorting bar 171 is directly coupled to a data line in odd columns on the array substrate. During the dry etching process for forming an active layer pattern of a TFT channel region on the array substrate, ions and free radicals for etching the active layer are bombarded, so that the data metal layer pattern carries electrostatic charges, the electrostatic charges aggregated at different positions on the data line are in different electric potentials, and the electrostatic charges on the odd data line may migrate and achieve a balance by the odd data shorting bar. When the balancing process of a large amount of electrostatic charges is implemented in a temporal magnitude of nanoseconds or microseconds, the electrostatic discharging is generated. A peak value of the electrostatic discharging may reach dozens of amperes, the instantaneous power is very large, and the generated energy of the electrostatic discharging electromagnetic pulses is significant enough to burn down the metal of the odd data shorting bar, which results in that a detecting signal cannot be loaded for the array substrate during the subsequent array testing process. Thus the detecting and repairing of the electric defects deteriorates. Furthermore, the intensity of the electric field generated on the gate insulation layer at the overlap between the data metal layer pattern and the gate metal layer pattern is stronger and stronger along with the continuous aggregation of the electrostatic charges on the data lines. When the intensity approaches a certain level, the strong electric field may break down a weak point of the gate insulation layer, and release the electrostatic charges of the data metal layer to the gate metal layer. As a result, the data metal layer and the gate metal layer may be short circuited, and such generated electrostatic discharging may significantly reduce the production yield rates of the array substrate.

SUMMARY OF THE INVENTION

The technical problem to be solved by the embodiments of the present invention lies in providing a array substrate, a manufacturing method for the same, and a display device, which are capable of solving the following technical problem in prior art: the electrostatic discharging generated by the array substrate during the dry etching process for forming the active layer pattern of the TFT channel region may burn down the data shorting bar and lead to the short circuit of the data metal layer and the gate metal layer. And thus the production yield rate of the array substrates is improved.

The embodiments of the present invention provide the following technical solutions for solving the above technical problem:

In one aspect, it is provided an array substrate, comprising a first data shorting bar formed on a gate metal layer and a second data shorting bar formed on a data metal layer, and the array substrate may further comprises:

a first conductive strip, being configured to be coupled to the first data shorting bar, wherein the width of the first conductive strip is greater than a+c+d;

a second conductive strip, being configured to be coupled to the second data shorting bar and not overlapped with the first data shorting bar, wherein the width of the second conductive strip is greater than b;

where a is the width of the first data shorting bar, b is the width of the second data shorting bar, c is the width of the second conductive strip, and d is a horizontal space between the second conductive strip and the first data shorting bar.

Furthermore, the first conductive strip may be formed by the material of a first transparent conductive layer; and the second conductive strip may be formed by the material of an active layer.

Furthermore, the array substrate may comprise:

a substrate;

a common electrode and the first conductive strip, being configured to be arranged on the substrate and formed by etching the first transparent conductive layer;

a gate line, a gate electrode, a gate shorting bar and the first data shorting bar, being configured to be arranged on the substrate on which the common electrode and the first conductive have been formed and formed by etching the gate metal layer, wherein the first data shorting bar is directly coupled to the first conductive strip;

a gate insulation layer, being configured to be arranged on the substrate on which the gate line, the gate electrode, the gate shorting bar and the first data shorting bar have been formed;

an active layer, an ohmic contact layer, and the second conductive strip formed by etching the active layer, being configured to be arranged on the gate insulation layer;

data lines, a source electrode, a drain electrode and the second data shorting bar, being configured to be arranged on the active layer and the ohmic contact layer and formed by etching the data metal layer, wherein the second data shorting bar is coupled to the second conductive strip by the ohmic contact layer;

a passivation layer, being configured to be arranged on the substrate on which the data lines, the source electrode, the drain electrode and the second data shorting bar have been formed, wherein the passivation layer has a passivation layer via hole at a position corresponding to the drain electrode; and a pixel electrode, being configured to be arranged on the passivation layer and formed by etching the second transparent conductive layer, wherein the pixel electrode is coupled to the drain electrode by the passivation layer via hole.

Alternatively, the first data shorting bar is an even data shorting bar, and is coupled to a data line in even columns on the array substrate by a via hole; the second data shorting bar is an odd data shorting bar, and is directly coupled to a data line in odd columns on the array substrate; or the first data shorting bar is an odd data shorting bar, and is coupled to a data line in odd columns on the array substrate by a via hole; the second data shorting bar is an even data shorting bar, and is directly coupled to a data line in even columns on the array substrate.

Furthermore, the first transparent conductive layer and the second transparent conductive layer each may be formed by a thin film of indium tin oxide, aluminum-doped zinc oxide, antimony-doped tin oxide or indium-doped zinc oxide;

the gate metal layer and the data metal layer each may be formed by a monolayer film of W, Cr, Ti, Ta, Mo, Al or Cu; or a composite film of any combination of W, Cr, Ti, Ta, Mo, Al and Cu.

Furthermore, the passivation layer may be formed by silicon nitride (SiNx), silicon dioxide ($SiO_2$), a structure of double layer film combined by silicon nitride and silicon dioxide, a structure of double layer film combined by silicon nitride and an organic insulation film, or a structure of double layer film combined by silicon dioxide and an organic insulation film.

The embodiment of the present invention also provides a display device comprising the array substrate as described above.

The embodiment of the present invention also provides a manufacturing method for an array substrate, the array substrate comprises a first data shorting bar formed by etching a gate metal layer and a second data shorting bar formed by etching a data metal layer, the manufacturing method comprises:

forming a first conductive strip coupled to the first data shorting bar, wherein the width of the first conductive strip is greater than a+c+d;

forming a second conductive strip coupled to the second data shorting bar and not overlapped with the first data shorting bar, wherein the width of the second conductive strip is greater than b;

where a is the width of the first data shorting bar, b is the width of the second data shorting bar, c is the width of the second conductive strip, and d is a horizontal space between the second conductive strip and the first data shorting bar.

Furthermore, the first conductive strip may be formed by the material of a first transparent conductive layer;

The second conductive strip may be formed by the material of an active layer.

Furthermore, the manufacturing method may comprise:
providing a substrate;

forming a common electrode on the substrate by a first transparent conductive layer, while forming the first conductive strip on the substrate;

forming a gate line, a gate electrode, a gate shorting bar and the first data shorting bar by the gate metal layer on the substrate on which the common electrode and the first conductive strip have been formed, wherein the first data shorting bar is directly coupled to the first conductive strip;

forming a gate insulation layer, an active layer, an ohmic contact layer and a data metal layer on the substrate on which the gate line, the gate electrode, the gate shorting bar and the first data shorting bar have been formed, while forming the second conductive strip on the substrate, forming data lines, a source electrode, a drain electrode and the second data shorting bar by the data metal layer, wherein the second data shorting bar is coupled to the second conductive strip by the ohmic contact layer and is formed by etching the active layer;

forming a passivation layer on the substrate on which the data lines, the source electrode, the drain electrode and the second data shorting bar have been formed, wherein the passivation layer has a passivation layer via hole at a position corresponding to the drain electrode; and forming a pixel electrode on the passivation layer by the second transparent conductive layer, wherein the pixel electrode is coupled to the drain electrode by the passivation layer via hole.

Alternatively, the first data shorting bar is an even data shorting bar, and is coupled to a data line in even columns on the array substrate by a via hole; the second data shorting bar is an odd data shorting bar, and is directly coupled to a data line in odd columns on the array substrate; or the first data shorting bar is an odd data shorting bar, and is coupled to a data line in odd columns on the array substrate by a via hole; the second data shorting bar is an even data shorting bar, and is directly coupled to a data line in even columns on the array substrate.

Furthermore, the passivation layer may be formed by silicon nitride (SiNx), silicon dioxide ($SiO_2$), a structure of double layer film combined by silicon nitride and silicon dioxide, a structure of double layer film combined by silicon nitride and an organic insulation film, or a structure of double layer film combined by silicon dioxide and an organic insulation film.

The embodiments of the present invention have the following beneficial effect:

In the above solutions, the first conductive strip that is coupled to the first data shorting bar and the second conductive strip that is coupled to the second data shorting bar are formed on the array substrate, the width of the first conductive strip is greater than the width of the first data shorting bar, the width of the second conductive strip is greater than the width of the second data shorting bar, and the first conductive strip is overlapped with the second conductive strip. Such a structure of the array substrate effectively increases the overlapped capacitance between the data metal layer and the gate metal layer. In the dry etching process for forming the active layer pattern of the TFT channel region, the electrostatic charges in different electric potentials at the data lines may migrate and achieve a balance by the second data shorting bar and the second wide conductive strip. And the electrostatic charges continuously aggregated on the data metal layer may scatter on the second conductive strip as much as possible. In case that equivalent amount of charges are aggregated at the data metal layer, the increment of the capacitance may reduce the electric potential difference generated by the electrostatic charges between the data metal layer and the gate metal layer. As a result, the intensity of the electric field generated on the gate insulation layer in the overlapped area between the data metal layer pattern and the gate metal layer pattern is reduced, so that the following technical problem is solved: the electrostatic discharging generated by the array substrate during the dry etching process of the active layer may burn down the metal of the second data shorting bar or lead to the short circuit of the data metal layer and the gate metal layer. And thus the production yield rate of the array substrates can be improved.

BRIEF DESCRIPTION OF THE DRAWINGS

The present invention will be more clearly understood from the description of preferred embodiments as set forth below, with reference to the accompanying drawings, wherein.

REFERENCE SIGNS

11: substrate
120: transparent common electrode
121: first conductive strip
130: gate shorting bar
131: gate line
132: gate electrode
14: gate insulation layer
15: semiconductor active layer
151: second conductive strip 152: active layer of TFT channel region
16: ohmic contact layer
170, 171: first and second data shorting bars
172, 173: odd and even data lines
174: source electrode
175: drain electrode
18: passivation layer
191, 192, 193, 194: passivation layer via hole
20: pixel electrode
201, 202, 203, 204: thin film of second transparent conductive layer at via hole

DETAILED DESCRIPTION OF THE PREFERRED EMBODIMENTS

In the following, the explanation will be made in details in associated with figures and specific embodiments to further clarify the technical problems to be solved by the embodiments of the present invention, the technical solutions and the advantages.

Regarding the following problems in the prior art: the electrostatic discharging generated by the dry etching process for the active layer of the array substrate may burn down the metal of the second data shorting bar or lead to the short circuit of the data metal layer and the gate metal layer, the embodiments of the present invention provide an array substrate, a manufacturing method for the same, and a display device, which may improve the production yield rate of the array substrates.

For achieving the above objects, the present invention provides an array substrate comprising a first data shorting bar formed on a gate metal layer and a second data shorting bar formed on a data metal layer, and the array substrate may further comprises:

a first conductive strip, being configured to be coupled to the first data shorting bar, wherein the width of the first conductive strip is greater than a+c+d; and a second conductive strip, being configured to be coupled to the second data shorting bar and not overlapped with the first data shorting bar, wherein the width of the second conductive strip is greater than b;

where a is the width of the first data shorting bar, b is the width of the second data shorting bar, c is the width of the second conductive strip, and d is a horizontal space between the second conductive strip and the first data shorting bar.

In this embodiment of the present invention, the first data shorting bar may be an even data shorting bar, and be coupled to a data line in even columns on the array substrate by a via hole; the second data shorting bar may be an odd data shorting bar, and be directly coupled to a data line in odd column on the array substrate.

Alternatively, the first data shorting bar may be an odd data shorting bar, and be coupled to a data line in odd columns on the array substrate by a via hole; the second data shorting bar may be an even data shorting bar, and be directly coupled to a data line in even columns on the array substrate.

In the following embodiments, the structure of the array substrate provided in the embodiments of the present invention will be further explained by assuming that, for example, the first data shorting bar is an even data shorting bar, and the second data shorting bar is an odd data shorting bar.

Figure 2:
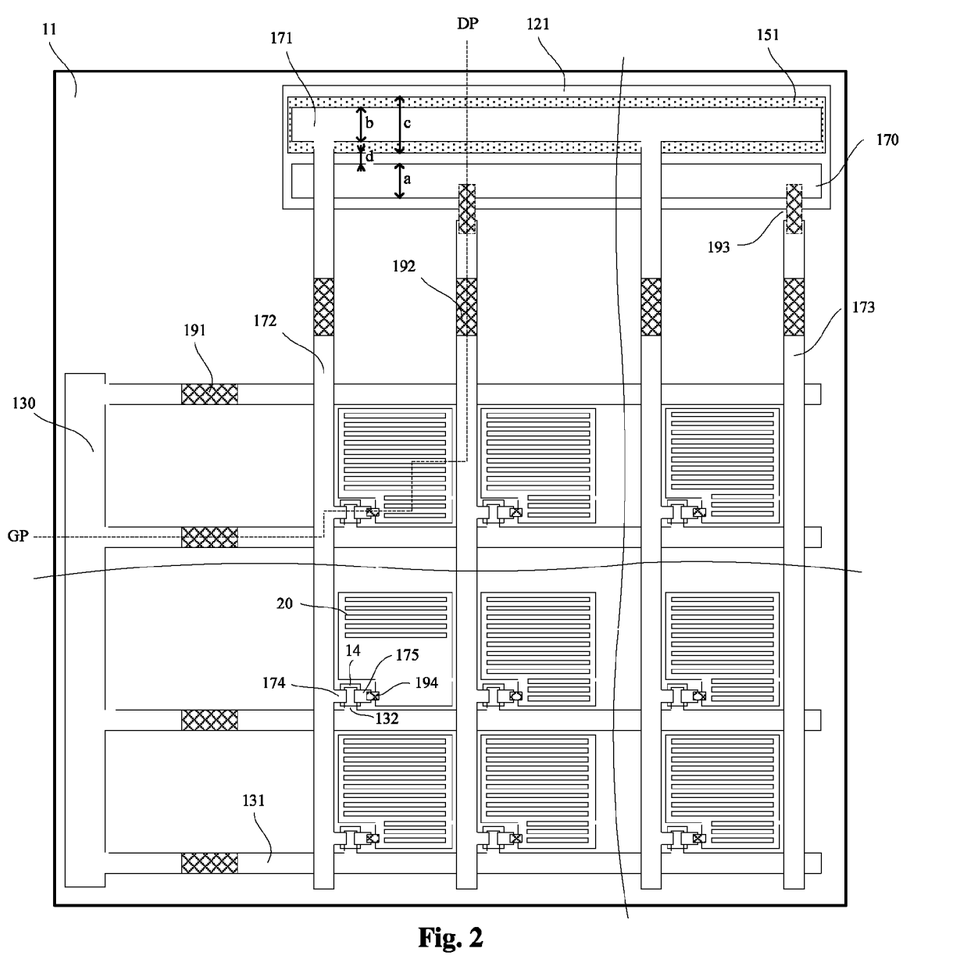
FIG. 2 illustrates a layout diagram for an array substrate according to an embodiment of the present invention.
Figure 11:
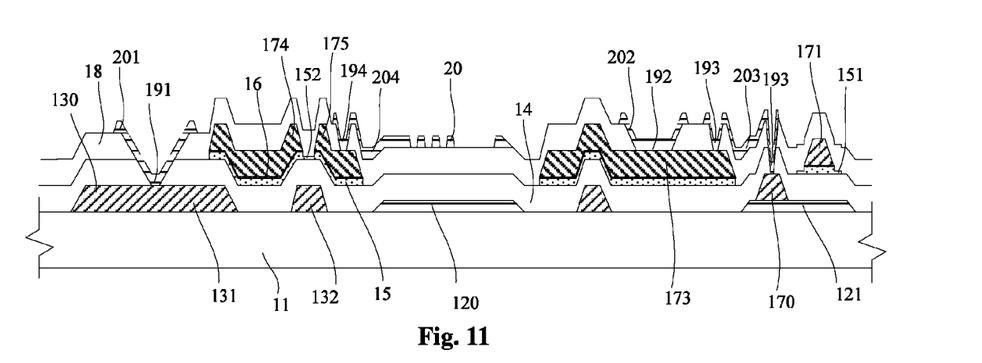
FIG. 11 illustrates a sectional diagram along a dotted line of GP-DP for the array substrate after the fifth photoetching process according to an embodiment of the present invention.

FIG. 2 illustrates a layout diagram for the array substrate according to the present invention, and FIG. 11 illustrates a sectional diagram along the dotted line of GP-DP for the substrate according to the present invention. As illustrated in FIG. 2, odd and even data lines 172, 173 are arranged in columns on the array substrate, the array substrate comprises an even data shorting bar 170 formed on a gate metal layer and an odd data shorting bar 171 formed on a data metal layer. The data line 173 in even columns on the array substrate may be coupled to the odd data shorting bar 170 by a via hole 193, and the data line 172 in odd column on the array substrate may be directly coupled to the odd data shorting bar 171. The array substrate may further comprise:

- a first conductive strip 121 that is coupled to the odd data shorting bar 170, the width of the first conductive strip 121 is greater than a+c+d; and
- a second conductive strip 151 that is coupled to the odd data shorting bar 171 and not overlapped with the even data shorting bar 170, the width of the second conductive strip 151 is greater than b.
- where a is the width of the even data shorting bar 170, b is the width of the odd data shorting bar 171, c is the width of the second conductive strip 151, and d is a horizontal space between the second conductive strip 151 and the even data shorting bar 170.

In the structure of the array substrate as described above, it is assumed that, for example, the even data shorting bar 170 is on the gate metal layer, and the odd data shorting bar 171 is on the data metal layer; however, in practice, it is also possible to arrange the odd data shorting bar on the gate metal layer, and arrange the even data shorting bar on the data metal layer. Such an alternative arrangement is common for those skilled in the art, and therefore the solution of arranging the odd data shorting bar on the gate metal layer and arranging the even data shorting bar on the data metal layer also falls into the protection scope of the present application.

Furthermore, the first conductive strip 121 may be formed by the material of a first transparent conductive layer; and the second conductive strip 151 may be formed by the material of an active layer.

Furthermore, as illustrated in FIG. 2 and FIG. 11, the array substrate provided by the embodiments of the present invention may specifically comprise:

- a substrate 11;
- a common electrode 120 and a first conductive strip 121 arranged on the substrate 11 and formed by etching a first transparent conductive layer;
- a gate line 131, a gate electrode 132, a gate shorting bar 130 and an even data shorting bar 170 arranged on the substrate on which the common electrode 120 and the first conductive 121 have been formed and formed by etching the gate metal layer, and the even data shorting bar 170 may be directly coupled to the first conductive strip 121;
- a gate insulation layer 14 arranged on the substrate on which the gate line 131, the gate electrode 132, the gate shorting bar 130 and the even data shorting bar 170 have been formed;
- a semiconductor active layer 15, an ohmic contact layer 16, and a second conductive strip 151 formed by etching an active layer, being arranged on the gate insulation layer 14;
- even, odd data lines 172, 173, a source electrode 174, a drain electrode 175 and an odd data shorting bar 171 arranged on the semiconductor active layer 15 and the ohmic contact layer 16 and formed by etching the data metal layer, the odd data shorting bar 171 may be coupled to the second conductive strip 151 by the ohmic contact layer 16;
- a passivation layer 18 arranged on the substrate on which the odd, even data lines 172, 173, the source electrode 174, the drain electrode 175 and the odd data shorting bar 171 have been formed, and the passivation layer 18 may have a passivation layer via hole 194 at the position corresponding to the drain electrode 175; and
- a pixel electrode 20, arranged on the passivation layer 18 and formed by etching the second transparent conductive layer, and the pixel electrode 20 may be coupled to the drain electrode 175 by the passivation layer via hole 194.

In the embodiments of the present invention, the first conductive strip being coupled to the even data shorting bar and the second conductive strip being coupled to the odd data shorting bar are formed on the array substrate, the width of the first conductive strip is greater than the width of the even data shorting bar, the width of the second conductive strip is greater than the width of the odd data shorting bar, and the first conductive strip is overlapped with the second conductive strip. Such a structure of the array substrate effectively increases the overlapped capacitance between the data metal layer and the gate metal layer. In the dry etching process for forming a pattern of the active layer of the TFT channel region, the electrostatic charges in different electric potentials at the data lines may migrate and achieve a balance by the odd data shorting bar and the second wide conductive strip, and the electrostatic charges continuously aggregated on the data metal layer may scatter on the second wide conductive strip as much as possible. In case that equivalent amount of charges are aggregated on the data metal layer, the increment of the capacitance may reduce the electric potential difference generated by the electrostatic charges between the data metal layer and the gate metal layer. As a result, the intensity of the electric field generated on the gate insulation layer in the overlapped area between the data metal layer pattern and the gate metal layer pattern is reduced, so that the following technical problem is solved: the electrostatic discharging generated by the array substrate during the dry etching process of the active layer may burn down the metal of the data shorting bar or lead to the short circuit of the data metal layer and the gate metal layer. And thus the production yield rate of the array substrates can be improved.

Furthermore, the present invention also provides a manufacturing method for the array substrate as illustrated in FIG. 2 and FIG. 11. The array substrate may comprise an even data shorting bar 170 formed by etching a gate metal layer and an odd data shorting bar 171 formed by etching a data metal layer. A data line 173 in even columns on the array substrate may be coupled to the even data shorting bar 170 by a via hole, and a data line 172 in odd columns on the array substrate may be directly coupled to the odd data shorting bar 171. Further, the manufacturing method may comprise:

- forming a first conductive strip 121 that is coupled to the even data shorting bar 170, the width of the first conductive strip 121 is greater than a+c+d;
- forming a second conductive strip 151 that is coupled to the odd data shorting bar 171 and not overlapped with the even data shorting bar 170, the width of the second conductive strip 151 is greater than b.
- where a is the width of the even data shorting bar 170, b is the width of the odd data shorting bar 171, c is the width of the second conductive strip 151, and d is a horizontal space between the second conductive strip 151 and the even data shorting bar 170.

Furthermore, the first conductive strip 121 may be formed by the material of a first transparent conductive layer; and the second conductive strip 151 may be formed by the material of an active layer.

Furthermore, the manufacturing method may specifically comprise:

- providing a substrate 11;

forming a common electrode 120 and a first conductive strip 121 on the substrate 11 by a first transparent conductive layer;

forming a gate line 131, a gate electrode 132, a gate shorting bar 130 and an even data shorting bar 170 by the gate metal layer on the substrate on which the common electrode 120 and the first conductive 121 have been formed, and the even data shorting bar 170 may be directly coupled to the first conductive strip 121;

forming a gate insulation layer 14, a semiconductor active layer 15, an ohmic contact layer 16 and a data metal layer on the substrate on which the gate line 131, the gate electrode 132, the gate shorting bar 130 and the odd data shorting bar 170 have been formed, forming odd, even data lines 172, 173, a source electrode 174, a drain electrode 175 and the odd data shorting bar 171 by the data metal layer, while forming a second conductive strip 151 by the active layer, and the second conductive strip 151 may be coupled to the odd data shorting bar 171 by an ohmic contact layer 16;

forming a passivation layer 18 on the substrate on which the odd, even data lines 172, 173, the source electrode 174, the drain electrode 175 and the odd data shorting bar 171 have been formed, and the passivation layer 18 may have a passivation layer via hole 194 at the position corresponding to the drain electrode 175; and forming a pixel electrode 20 on the passivation layer 18 by the second transparent conductive layer, and the pixel electrode 20 may be coupled to the drain electrode 175 by the passivation layer via hole 194.

In the embodiments of the present invention, the first conductive strip being coupled to the even data shorting bar and the second conductive strip being coupled to the odd data shorting bar are formed on the array substrate, the width of the first conductive strip is greater than the width of the even data shorting bar, the width of the second conductive strip is greater than the width of the odd data shorting bar, and the first conductive strip is overlapped with the second conductive strip. Such a structure of the array substrate effectively increases the overlapped capacitance between the data metal layer and the gate metal layer. In the dry etching process for forming the active layer pattern of the TFT channel region, the electrostatic charges in different electric potentials at the data lines may migrate and achieve a balance by the odd data shorting bar and the second wide conductive strip, and the electrostatic charges continuously aggregated on the data metal layer may scatter on the second wide conductive strip as much as possible. In case that equivalent amount of charges are aggregated on the data metal layer, the increment of the capacitance may reduce the electric potential difference generated by the electrostatic charges between the data metal layer and the gate metal layer. As a result, the intensity of the electric field generated on the gate insulation layer in the overlapped area between the data metal layer pattern and the gate metal layer pattern is reduced, so that the following technical problem is solved: the electrostatic discharging generated by the array substrate during the dry etching process of the active layer may burn down the metal of the data shorting bar or lead to the short circuit of the data metal layer and the gate metal layer. And thus the production yield rate of the array substrates can be improved.

In the following, the array substrate and the manufacturing method for the same according to the embodiments of the present invention will be further explained in association with the specific embodiment.

Figure 3:
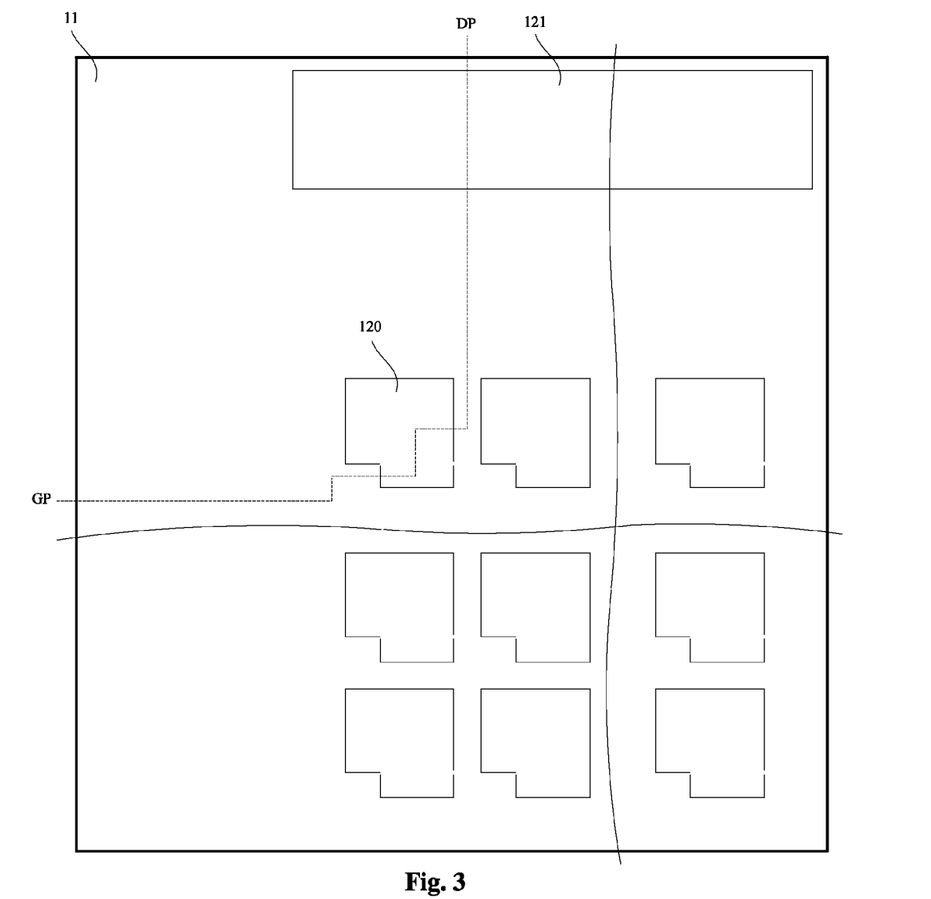
FIG. 3 illustrates a layout diagram for the array substrate after the first photoetching process according to an embodiment of the present invention.
Figure 4:
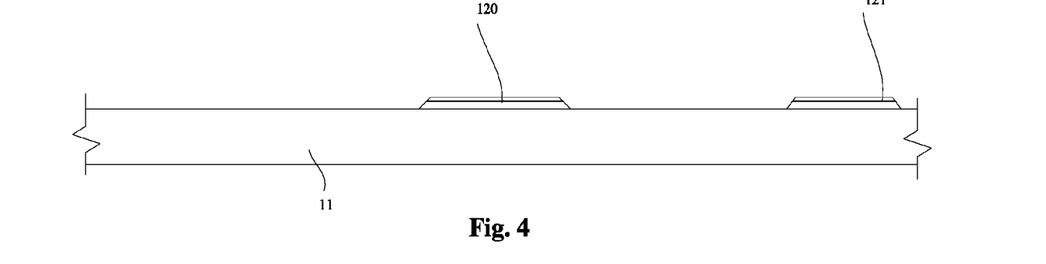
FIG. 4 illustrates a sectional diagram along a dotted line of GP-DP for the array substrate after the first photoetching process according to an embodiment of the present invention.

As illustrated in FIG. 2-FIG. 11, the manufacturing method for the array substrate according to the present embodiments may comprise the following steps:

Step 1: providing a substrate 11, and forming a common electrode 120 and a first conductive strip 121 on the substrate 11 by a first transparent conductive layer;

Specifically, the first transparent conductive layer is formed on the substrate 11, the first transparent conductive lay may have a thin film of indium tin oxide, aluminum-doped zinc oxide, antimony-doped tin oxide or indium-doped zinc oxide, the first common electrode 120 may be formed by photoetching process, while a wide transparent conductive strip (i.e. the first conductive strip) 121 may be formed at a preset position of the even data shorting bar 170, wherein the width of the first conductive strip 121 is greater than a+c+d, as illustrated in FIG. 3 and FIG. 4.

Where a is the width of the even data shorting bar 170, b is the width of the odd data shorting bar 171, c is the width of the second conductive strip 151, and d is a horizontal space between the second conductive strip 151 and the even data shorting bar 170. The photoetching process may comprise such steps as photoresist coating, exposure, development, etching, photoresist stripping and etc.

Figure 5:
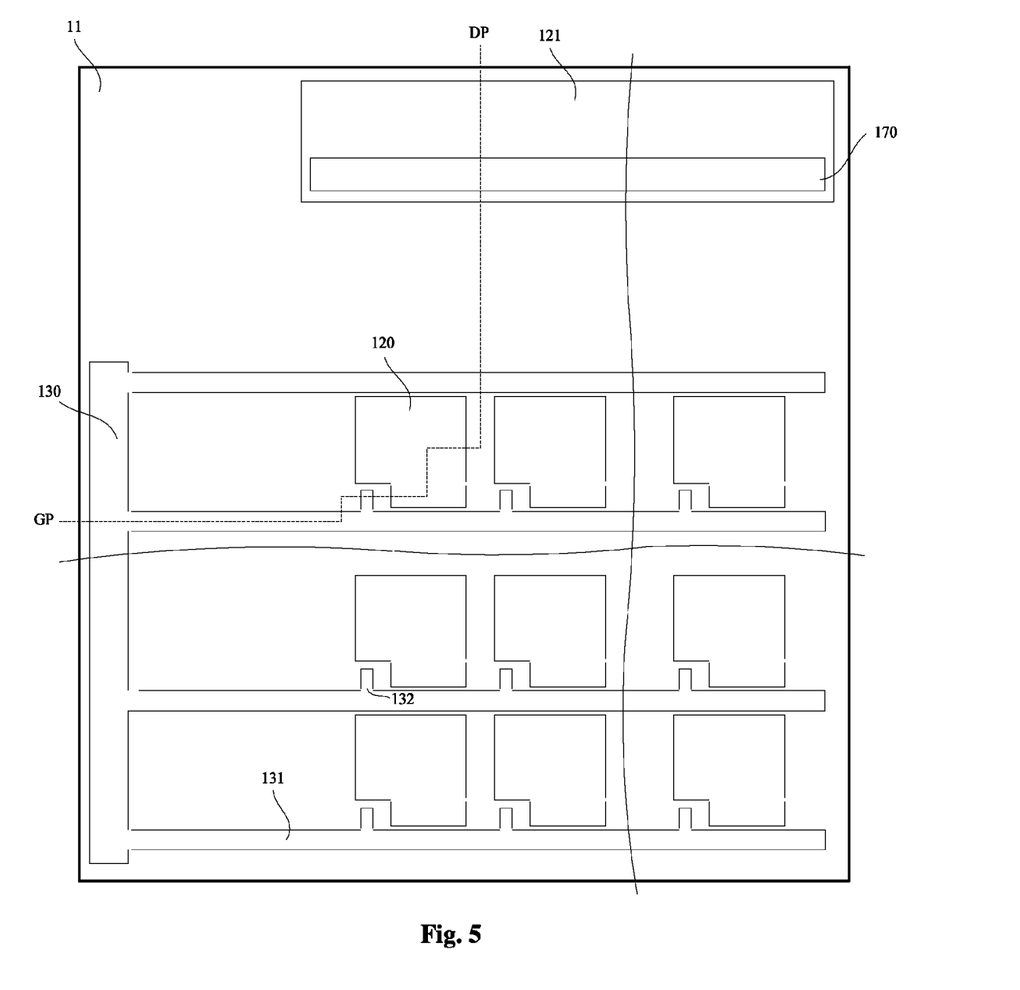
FIG. 5 illustrates a layout diagram for the array substrate after the second photoetching process according to an embodiment of the present invention.
Figure 6:
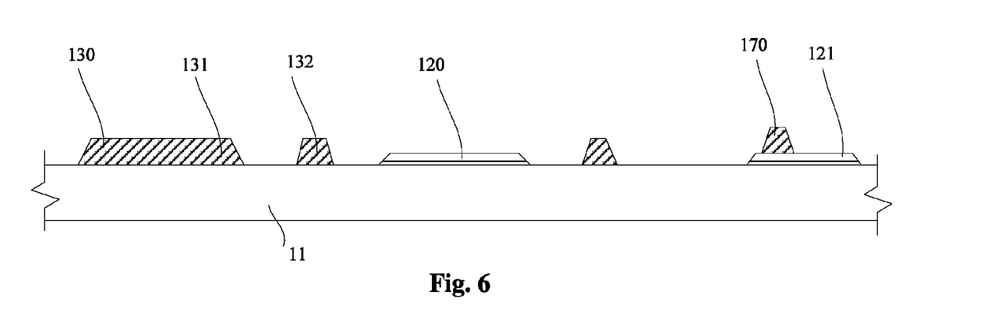
FIG. 6 illustrates a sectional diagram along a dotted line of GP-DP for the array substrate after the second photoetching process according to an embodiment of the present invention.

Step 2: forming a gate line 131, a gate electrode 132, a gate shorting bar 130 and an even data shorting bar 170 on the substrate on which the step 1 has been implemented, and the even data shorting bar 170 may be coupled to the first conductive strip 121;

Specifically, the gate metal layer may be formed on the substrate on which the step 1 has been implemented, the gate shorting bar 130, the gate line 131, the gate electrode 132, and the even data shorting bar 170 may be formed by the photoetching process, and the even data shorting bar 170 may be directly coupled to the first conductive strip 121, as illustrated in FIG. 5 and FIG. 6.

Where the gate metal layer may be formed by a monolayer film of W, Cr, Ti, Ta, Mo, Al or Cu, or a composite film of any combination of W, Cr, Ti, Ta, Mo, Al and Cu.

Figure 7:
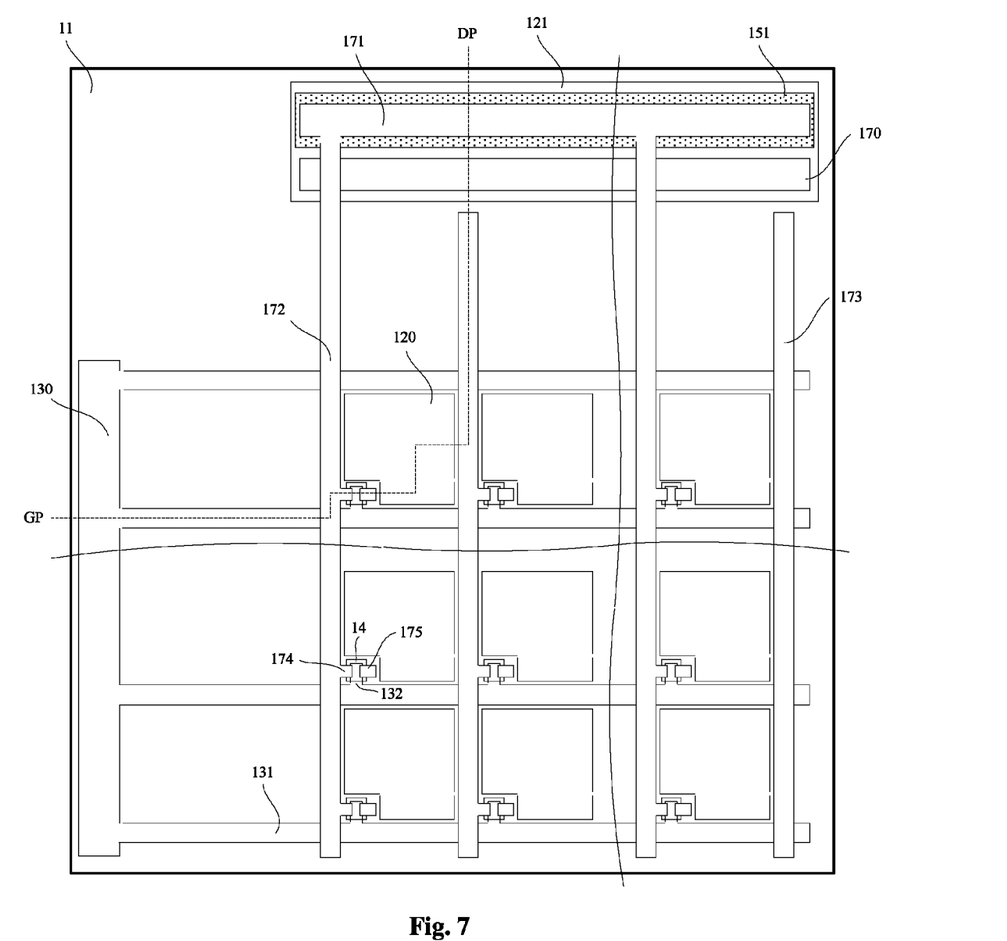
FIG. 7 illustrates a layout diagram for the array substrate after the third photoetching process according to an embodiment of the present invention.
Figure 8:
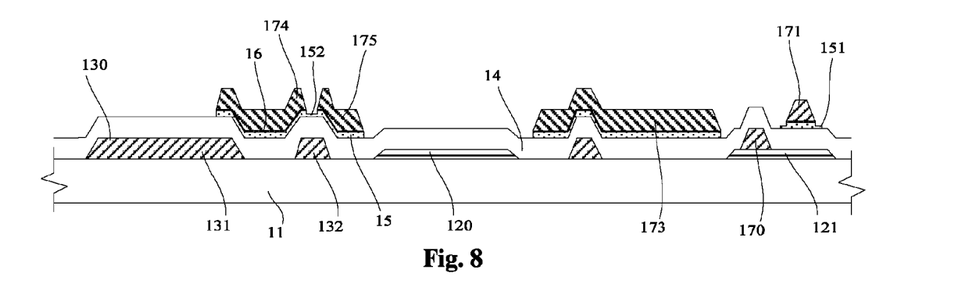
FIG. 8 illustrates a sectional diagram along a dotted line of GP-DP for the array substrate after the third photoetching process according to an embodiment of the present invention.

Step 3: forming a gate insulation layer 14, an active layer 15, an ohmic contact layer 16 and a data metal layer on the substrate on which the step 2 has been implemented, forming odd, even data lines 172, 173, a source electrode 174, a drain electrode 175 and the odd data shorting bar 171 by the data metal layer, while forming a second conductive strip 151 by the active layer, and the odd data shorting bar 171 may be coupled to the second conductive strip 151 by an ohmic contact layer 16;

Specifically, the gate insulation layer 14, the semiconductor active layer 15 and the ohmic contact layer 16 may be consecutively formed on the substrate on which the step 2 has been implemented, then the data metal layer is formed, and the odd data shorting bar 171, the odd, even data lines 172, 173, the patterns of the source electrode 174, the drain electrode 175 and the active layer of the TFT channel region 152 may be formed by the processes of halftone mask exposure, wet etching and dry etching, while a wide semiconductor conductive strip (i.e. the second conductive strip) 151 may be formed on the active layer below the odd data shorting bar 171, as illustrated in FIG. 7 and FIG. 8.

Where the data metal layer may be formed by a monolayer film of W, Cr, Ti, Ta, Mo, Al or Cu, or a composite film of any combination of W, Cr, Ti, Ta, Mo, Al and Cu; the gate insulation may be formed by silicon nitride (SiNx), silicon dioxide ($SiO_2$) or a structure of double layer thin film combined by silicon nitride and silicon dioxide; and the semiconductor may have a thin film of amorphous silicon (a-Si), polycrystalline silicon, indium gallium zinc oxide (In—Ga—Zn—O), or etc.

Figure 9:
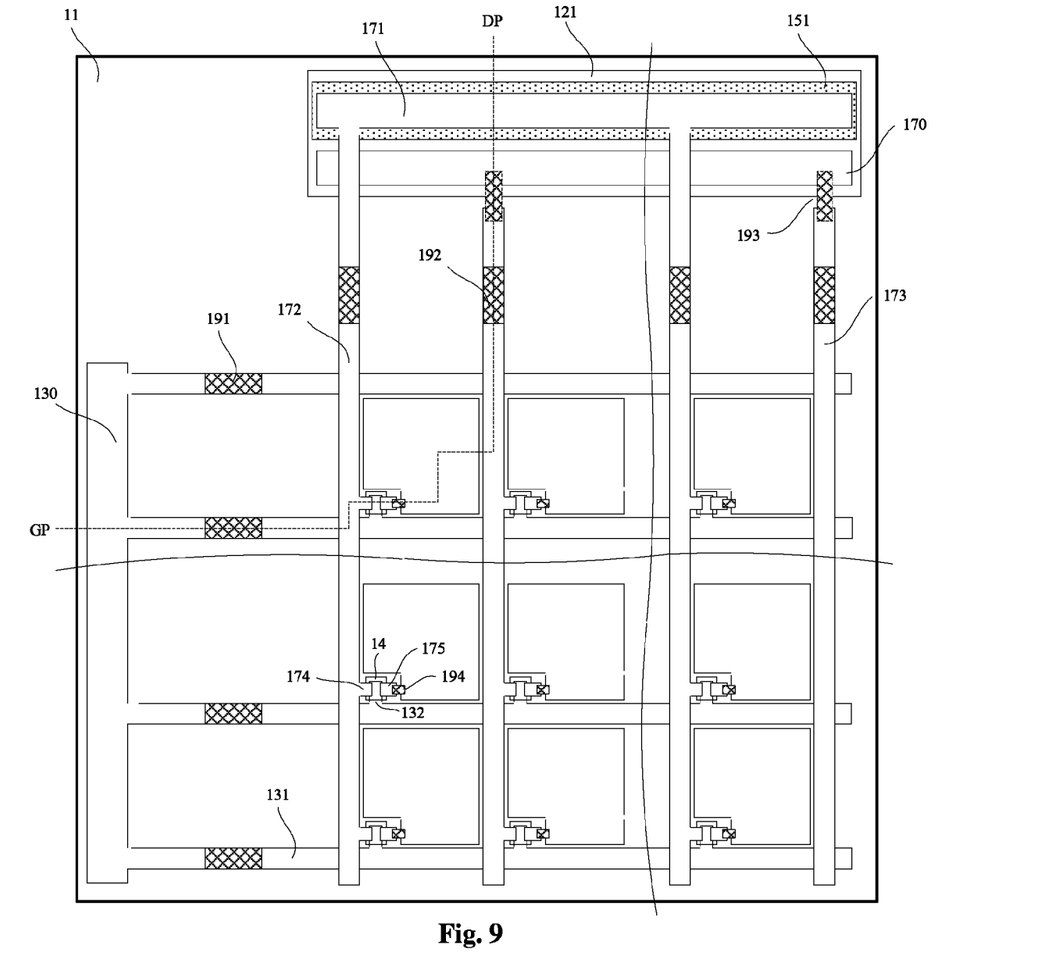
FIG. 9 illustrates a layout diagram for the array substrate after the fourth photoetching process according to an embodiment of the present invention.
Figure 10:
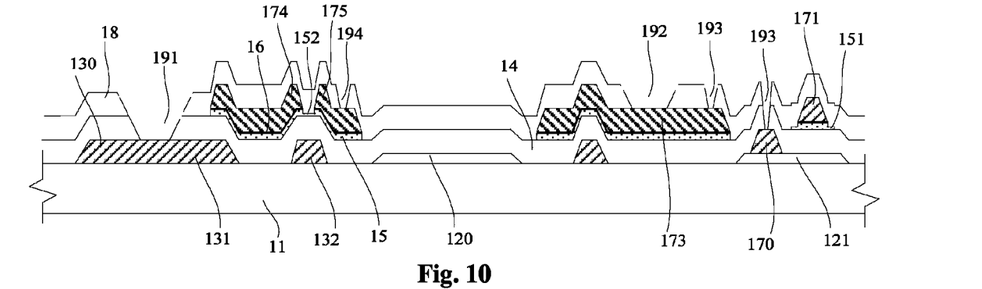
FIG. 10 illustrates a sectional diagram along a dotted line of GP-DP for the array substrate after the fourth photoetching process according to an embodiment of the present invention.

Step 4: forming a passivation layer 18 on the substrate on which the step 3 has been implemented, and the passivation layer 18 may have a passivation layer via hole 194 at the position corresponding to the drain electrode 175;

Specifically, the passivation layer may be formed on the substrate on which the step 3 has been implemented, and the passivation layer via hole 194 may be formed at the position corresponding to the drain electrode 175 by the photoetching process, while various other types of via holes are formed, comprising a Gate Pad via hole 191, a Data Pad via hole 192, a connecting via hole 193 between the even data line and the even data shorting bar, as illustrated in FIG. 9 and FIG. 10.

Where the passivation layer may adopt silicon nitride (SiNx), silicon dioxide ($SiO_2$), a structure of double layer film combined by silicon nitride, a structure of double layer film combined by silicon nitride and an organic insulation film, or a structure of double layer film combined by silicon dioxide and an organic insulation film.

Step 5: forming a pixel electrode 20 on the substrate on which the step 4 has been implemented.

Specifically, the second transparent conductive layer may be formed on the substrate on which the step 4 has been implemented, the pixel electrode 20 may be formed by the photoetching process, and the pixel electrode 20 may be coupled to the drain electrode 175 by the passivation layer via hole 194, as illustrated in FIG. 2 and FIG. 11.

The even data line 173 and the even data shorting bar 170 may be coupled to a second transparent conductive layer thin film by the via hole 193; while the second transparent conductive layer thin film may be formed at the Gate Pad via hole 191 and the Data Pad via hole 192 to protect the metal electrode from an external damage.

At last, the array substrate as illustrated in FIG. 2 and FIG. 11 is formed by the above described steps 1-5.

Figure 12:
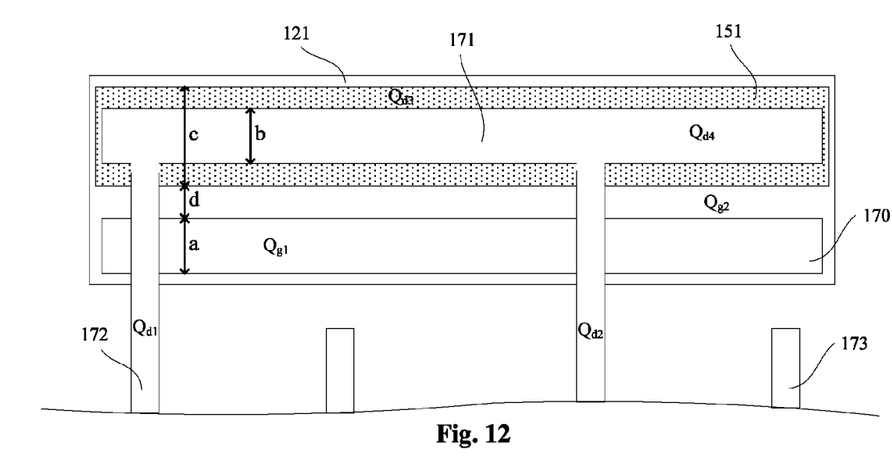
FIG. 12 illustrates a plane diagram for the electrostatic charges generated by the array substrate during an active layer dry etching process and distributed near the data shorting bar.
Figure 13:
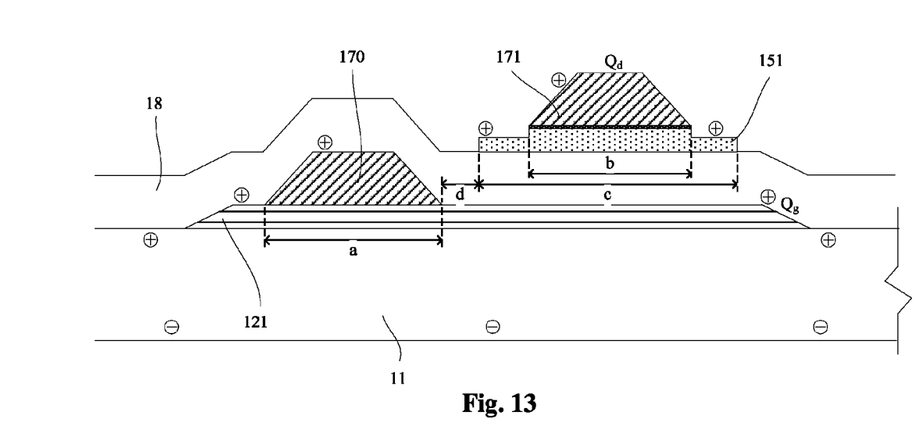
FIG. 13 illustrates a sectional diagram for the electrostatic charges generated by the array substrate during an active layer dry etching process and distributed near the data shorting bar.

FIG. 12 and FIG. 13 respectively illustrate a plane diagram and a sectional diagram for the electrostatic charges generated by the array substrate during the active layer dry etching process and distributed near the data shorting bar according to the embodiments of the present invention. It can be seen that, in this embodiment, a wide transparent conductive strip 121 may be further arranged below the even data shorting bar 170, the transparent conductive strip 121 may be directly coupled to the odd data shorting bar 170, a wide semiconductor conductive strip 151 may be further arranged below the odd data shorting bar 171, the semiconductor conductive strip 151 may be coupled to the odd data shorting bar 171 by the ohmic contact layer 16; the semiconductor conductive strip 151 may be not overlapped with the even data shorting bar 170, and its width c is greater than the width b of the odd data shorting bar 171, the transparent conductive strip 121 may be overlapped with the semiconductor conductive strip 151, and its width is greater than a sum of the width a of the even data shorting bar 170, the width c of the semiconductor conductive strip 151, the horizontal space d between the even data shorting bar 170 and the semiconductor conductive strip 151, i.e., a+c+d. In such a structure, a large capacitance is formed between the data metal layer and the gate metal layer. In the dry etching process for forming the active layer pattern of the TFT channel region on the array substrate, the electrostatic charges in different electric potentials at the data lines may migrate and achieve a balance by the odd data shorting bar 171 and the wide semiconductor conductive strip 151, and the electrostatic charges continuously aggregated on the data metal layer may scatter on the wide semiconductor conductive strip 151 as much as possible. In case that equivalent amount of charges are aggregated on the data metal layer, the large capacitance formed between the semiconductor conductive strip 151 and the transparent conductive strip 121 may effectively reduce the electric potential difference generated by the electrostatic charges between the data metal layer and the gate metal layer, and may also reduce the intensity of the electric field bearing by the gate insulation layer in the overlapped area between the data metal layer pattern and the gate metal layer pattern, so that the following technical problem is solved: the electrostatic discharging generated by the array substrate during the dry etching process of the active layer may burn down the metal of the data metal shorting bar and lead to the short circuit of the data metal layer and the gate metal layer. And thus the production yield rate of the array substrates can be improved.

The present invention also provides a display device, comprising the array substrate as illustrated in FIG. 2 and FIG. 11. Specifically, the display device may be an LCD apparatus, such as an LCD panel, an LCD TV, a mobile phone, an LCD monitor, or etc, which comprises a color film, and the array substrate according to the above embodiments; besides the LCD apparatus, the display device may also be other types of display device, such as an e-reader, which does not comprise the color film substrate, and comprise the array substrate according to the above embodiments.

The above descriptions are only preferred embodiments of the present invention. It should be noted that, for those ordinary skilled in the art, many modifications and polishes may be made without departure from the principles of the present invention, and these modification and polishes should also be deemed to be fallen into the protection scope of the present invention.

What is claimed is:

1. An array substrate, comprising a first data shorting bar formed on a gate metal layer and a second data shorting bar formed on a data metal layer, wherein the array substrate further comprises:
   a first conductive strip, being configured to be coupled to the first data shorting bar, wherein the width of the first conductive strip is greater than a+c+d; and
   a second conductive strip, being configured to be coupled to the second data shorting bar and not overlapped with the first data shorting bar, wherein the width of the second conductive strip is greater than b;
   where a is the width of the first data shorting bar, b is the width of the second data shorting bar, c is the width of the second conductive strip, and d is the horizontal space between the second conductive strip and the first data shorting bar.

2. The array substrate according to claim 1, wherein the first conductive strip is formed by the material of a first transparent conductive layer; and the second conductive strip is formed by the material of an active layer.

3. The array substrate according to claim 1, wherein the array substrate comprises:
   a substrate;
   a common electrode and the first conductive strip, being configured to be arranged on the substrate and formed by etching the first transparent conductive layer;
   a gate line, a gate electrode, a gate shorting bar and the first data shorting bar, being configured to be arranged on the substrate on which the common electrode and the first conductive strip have been formed and formed by etching the gate metal layer, wherein the first data shorting bar is directly coupled to the first conductive strip;

a gate insulation layer, being configured to be arranged on the substrate on which the gate line, the gate electrode, the gate shorting bar and the first data shorting bar have been formed;

an active layer, an ohmic contact layer, and the second conductive strip formed by the material of the active layer, being configured to be arranged on the gate insulation layer;

data lines, a source electrode, a drain electrode and the second data shorting bar, being configured to be arranged on the active layer and the ohmic contact layer and formed by etching the data metal layer, wherein the second data shorting bar is coupled to the second conductive strip by the ohmic contact layer;

a passivation layer, being configured to be arranged on the substrate on which the data line, the source electrode, the drain electrode and the second data shorting bar have been formed, wherein the passivation layer has a passivation layer via hole at a position corresponding to the drain electrode; and a pixel electrode, being configured to be arranged on the passivation layer and formed by etching a second transparent conductive layer, wherein the pixel electrode is coupled to the drain electrode by the passivation layer via hole.

4. The array substrate according to claim 3, wherein the first transparent conductive layer and the second transparent conductive layer each is formed by a thin film of indium tin oxide, aluminum-doped zinc oxide, antimony-doped tin oxide or indium-doped zinc oxide;

the gate metal layer and the data metal layer each is formed by a monolayer film of W, Cr, Ti, Ta, Mo, Al or Cu; or a composite film of any combination of W, Cr, Ti, Ta, Mo, Al and Cu.

5. The array substrate according to claim 3, wherein the passivation layer is formed by silicon nitride (SiNx), silicon dioxide ($SiO_2$), a structure of double layer film combined by silicon nitride and silicon dioxide, a structure of double layer film combined by silicon nitride and an organic insulation film, or a structure of double layer film combined by silicon dioxide and an organic insulation film.

6. The array substrate according to claim 1, wherein the first data shorting bar is an even data shorting bar, and is coupled to a data line in even columns on the array substrate by a via hole; and the second data shorting bar is an odd data shorting bar, and is directly coupled to a data line in odd columns on the array substrate; or the first data shorting bar is an odd data shorting bar, and is coupled to a data line in odd columns on the array substrate by a via hole; the second data shorting bar is an even data shorting bar, and is directly coupled to a data line in even columns on the array substrate.

7. A manufacturing method for an array substrate according to claim 1, which comprises a first data shorting bar formed by etching a gate metal layer and a second data shorting bar formed by etching a data metal layer, wherein the manufacturing method comprises:

forming a first conductive strip that is coupled to the first data shorting bar, wherein the width of the first conductive strip is greater than a+c+d; and forming a second conductive strip that is coupled to the second data shorting bar and not overlapped with the first data shorting bar, wherein the width of the second conductive strip is greater than b;

where a is the width of the first data shorting bar, b is the width of the second data shorting bar, c is the width of the second conductive strip, and d is the horizontal space between the second conductive strip and the first data shorting bar.

8. The manufacturing method according to claim 7, wherein the first conductive strip is formed by the material of a first transparent conductive layer; and the second conductive strip is formed by the material of an active layer.

9. The manufacturing method according to claim 7, wherein the manufacturing method comprises:

providing a substrate;

forming a common electrode on the substrate by the first transparent conductive layer, while forming the first conductive strip on the substrate;

forming a gate line, a gate electrode, a gate shorting bar and the first data shorting bar by a gate metal layer on the substrate on which the common electrode and the first conductive strip have been formed, wherein the first data shorting bar is directly coupled to the first conductive strip;

forming a gate insulation layer, an active layer, an ohmic contact layer and a data metal layer on the substrate on which the gate line, the gate electrode, the gate shorting bar and the first data shorting bar have been formed, while forming the second conductive strip on the substrate, forming data lines, a source electrode, a drain electrode and the second data shorting bar by the data metal layer, wherein the second data shorting bar is coupled to the second conductive strip by the ohmic contact layer and is formed by etching the active layer;

forming a passivation layer on the substrate on which the data line, the source electrode, the drain electrode and the second data shorting bar have been formed, wherein the passivation layer has a passivation layer via hole at a position corresponding to the drain electrode; and forming a pixel electrode on the passivation layer by the second transparent conductive layer, wherein the pixel electrode is coupled to the drain electrode by the passivation layer via hole.

10. The manufacturing method according to claim 9, wherein the passivation layer is formed by silicon nitride (SiNx), silicon dioxide ($SiO_2$), a structure of double layer film combined by silicon nitride and silicon dioxide, a structure of double layer film combined by silicon nitride and an organic insulation film, or a structure of double layer film combined by silicon dioxide and an organic insulation film.

11. The manufacturing method according claim 7, wherein the first data shorting bar is an odd data shorting bar, and is coupled to a data line in even columns on the array substrate by a via hole; the second data shorting bar is an odd data shorting bar, and is directly coupled to a data line in odd columns on the array substrate; or the first data shorting bar is an odd data shorting bar, and is coupled to a data line in odd columns on the array substrate by a via hole; the second data shorting bar is an even data shorting bar, and is directly coupled to a data line in even columns on the array substrate.

12. A display device, comprising an array substrate that comprises a first data shorting bar formed on a gate metal layer and a second data shorting bar formed on a data metal layer, wherein the array substrate further comprises:

a first conductive strip, being configured to be coupled to the first data shorting bar, wherein the width of the first conductive strip is greater than a+c+d; and a second conductive strip, being configured to be coupled to the second data shorting bar and not overlapped with the first data shorting bar, wherein the width of the second conductive strip is greater than b;

where a is the width of the first data shorting bar, b is the width of the second data shorting bar, c is the width of the second conductive strip, and d is the horizontal space between the second conductive strip and the first data shorting bar.

13. The display device according to claim 12, wherein the first conductive strip is formed by the material of a first transparent conductive layer; and the second conductive strip is formed by the material of an active layer.

14. The display device according to claim 12, wherein the array substrate comprises:
    a substrate;
    a common electrode and the first conductive strip, being configured to be arranged on the substrate and formed by etching the first transparent conductive layer;
    a gate line, a gate electrode, a gate shorting bar and the first data shorting bar, being configured to be arranged on the substrate on which the common electrode and the first conductive strip have been formed and formed by etching the gate metal layer, wherein the first data shorting bar is directly coupled to the first conductive strip;
    a gate insulation layer, being configured to be arranged on the substrate on which the gate line, the gate electrode, the gate shorting bar and the first data shorting bar have been formed;
    an active layer, an ohmic contact layer, and the second conductive strip formed by the material of the active layer, being configured to be arranged on the gate insulation layer;
    data lines, a source electrode, a drain electrode and the second data shorting bar, being configured to be arranged on the active layer and the ohmic contact layer and formed by etching the data metal layer, wherein the second data shorting bar is coupled to the second conductive strip by the ohmic contact layer;
    a passivation layer, being configured to be arranged on the substrate on which the data line, the source electrode, the drain electrode and the second data shorting bar have been formed, wherein the passivation layer has a passivation layer via hole at a position corresponding to the drain electrode; and
    a pixel electrode, being configured to be arranged on the passivation layer and formed by etching the second transparent conductive layer, wherein the pixel electrode is coupled to the drain electrode by the passivation layer via hole.

15. The display device according to claim 14, wherein the first transparent conductive layer and the second transparent conductive layer each is formed by a thin film of indium tin oxide, aluminum-doped zinc oxide, antimony-doped tin oxide or indium-doped zinc oxide;
    the gate metal layer and the data metal layer each is formed by a monolayer film of W, Cr, Ti, Ta, Mo, Al or Cu; or a composite film of any combination of W, Cr, Ti, Ta, Mo, Al and Cu.

16. The display device according to claim 14, wherein the passivation layer is formed by silicon nitride (SiNx), silicon dioxide ($SiO_2$), a structure of double layer film combined by silicon nitride and silicon dioxide, a structure of double layer film combined by silicon nitride and an organic insulation film, or a structure of double layer film combined by silicon dioxide and an organic insulation film.

17. The display device according to claim 12, wherein the first data shorting bar is an even data shorting bar, and is coupled to a data line in even columns on the array substrate by a via hole; and the second data shorting bar is an odd data shorting bar, and is directly coupled to a data line in odd columns on the array substrate; or
    the first data shorting bar is an odd data shorting bar, and is coupled to a data line in odd columns on the array substrate by a via hole; the second data shorting bar is an even data shorting bar, and is directly coupled to a data line in even columns on the array substrate.

* * * * *